United States Patent [19]
Weisbrod et al.

[11] Patent Number: 5,410,583
[45] Date of Patent: Apr. 25, 1995

[54] SHIFT REGISTER USEFUL AS A SELECT LINE SCANNER FOR A LIQUID CRYSTAL DISPLAY

[75] Inventors: Sherman Weisbrod, Skillman; Ruquiya I. A. Huq, Plainsboro, both of N.J.

[73] Assignee: RCA Thomson Licensing Corporation, Princeton, N.J.

[21] Appl. No.: 289,324

[22] Filed: Aug. 11, 1994

Related U.S. Application Data

[63] Continuation of Ser. No. 193,930, Feb. 9, 1994, abandoned, which is a continuation-in-part of Ser. No. 141,364, Oct. 28, 1993, abandoned.

[51] Int. Cl.[6] ............................................. G11C 19/00
[52] U.S. Cl. ..................................... 377/75; 327/185; 327/211; 327/544
[58] Field of Search ............ 377/75; 307/296.3, 272.1, 307/272.3, 279; 327/544, 185, 211

[56] References Cited

U.S. PATENT DOCUMENTS

| | | | |
|---|---|---|---|
| 5,055,709 | 10/1991 | Smith | 307/279 |
| 5,055,720 | 10/1991 | Tiede | 307/279 |
| 5,222,082 | 6/1993 | Plus | 377/79 |
| 5,300,822 | 4/1994 | Sugahara et al. | 307/272.3 |

Primary Examiner—Margaret Rose Wambach
Attorney, Agent, or Firm—Joseph S. Tripoli; Eric P. Herrmann; Ronald H. Kurdyla

[57] ABSTRACT

A select line scanner for a liquid crystal display includes a plurality of cascaded stages each having an input terminal and an output terminal. Each stage includes a push-pull output circuit including pull up and pull down transistors driven with separate control signals. A further transistor has its conduction path coupled between the control electrode and a point of potential of sufficient value to turn the pull up transistor off. The control electrode of the further transistor is coupled to an output of a succeeding one of the cascaded stages to insure that the output of the respective stage cannot drift to an on state.

20 Claims, 4 Drawing Sheets

SHIFT REGISTER USEFUL AS A SELECT LINE SCANNER FOR A LIQUID CRYSTAL DISPLAY

This is a continuation of application Ser. No. 193,930, filed Feb. 9, 1994, now abandoned, which is a continuation-in-part application of application Ser. No. 08/141,364, filed 28 Oct. 1993, now abandoned.

BACKGROUND

This invention relates generally to shift registers and particularly to a shift register stage useful as a select line scanner for liquid crystal displays.

Liquid crystal television and computer displays (LCDs) are known in the art. For example, see U.S. Pat. Nos. 4,742,346 and 4,766,430, both issued to G. G. Gillette et al. Displays of the type described in the Gillette patents include a matrix of liquid crystal cells which are arranged at the crossovers of data lines and select lines. The select lines are sequentially selected by a select line scanner to produce the horizontal lines of the display. The data lines apply the brightness (gray scale) signals to the columns of liquid crystal cells as the select lines are sequentially selected.

Preferably, the drive circuitry, which drives the select line scanner, which selects the horizontal lines to be displayed, is fabricated directly onto the same substrate and at the same time as the liquid crystal cells are fabricated. Also, because a large number of data lines and select lines are required for a television or computer display, and because the small pixel pitch limits the space available for laying out the driver circuitry, it is essential to keep the circuitry as simple as possible.

FIG. 1 illustrates an example of a known scan register described in U.S. Pat. No. 5,222,082, which may be integrated with a liquid crystal display device. This register is driven with multiphase clocking signals C1, C2, C3, with different ones of the clock phases applied to different ones of the scan register stages 11.

FIG. 2 illustrates one of the scan register stages in detail. The scan register stage includes an input section including transistors 18 and 19, an intermediate section including transistors 20 and 21 and an output section including transistors 16 and 17.

The output section is arranged as a push-pull amplifier, with a clocked supply potential connected to its supply connection 14. An output is accessed at the interconnection of the transistors 16 and 17.

The input section is arranged as a switched amplifier to exhibit a predetermined potential during the clock phase applied to the supply terminal of the output section. The output signal, P1, of the input stage, is coupled to drive the output transistor 16. More particularly the output, P1, follows the input signal applied to the gate electrode of transistor 18. The output of the input section will be high when the clock phase applied to terminal 14 goes high, and a high level is translated to the output terminal 13. The high level at node P1 is retained at node P1 until the occurrence of a clock phase C3 when the input signal is low. Thus the gate of the output transistor 16 will be at a high level when the clock C1 goes high providing a charging path to output 13 and when clock C1 goes low, providing a path to discharge the output node 13.

The intermediate section is arranged as a clocked inverting amplifier responsive to the input signal. The output of the intermediate stage is coupled to the gate electrode of the pull down transistor 17 of the output stage. The intermediate stage includes pull up and pull down transistors 20 and 21 respectively. The conductance of transistor 21 is greater than that of transistor 20 so that if both transistors 20 and 21 are conducting concurrently, the output potential at node P2 will remain low. Thus if the clock applied to transistor 20 is high when the input signal is high, the output transistor 17 will be maintained in a non-conducting state. However since the application of the stage is as a scan register, input signal pulses occur relatively infrequently. As a result node P2 will normally be charged high for every clock pulse of clock phase C3 and output transistor 17 will normally be conducting.

The drains of transistors 18 and 20 receive a relatively positive biasing voltage $V_{DD}$ of about 16 volts. Thus node P2 is normally biased at about 16 volts. This places excessive stress on the gate electrodes of transistors 19 and 17 which tends to cause a considerable rise in their respective threshold voltages over time. As the threshold of transistor 19 increases, its ability to discharge node P1 decreases, and more time is required to turn off transistor 16. The result is that some of the clock C1 voltage may leak onto the output node 13 and undesirably affect subsequent register stages as well as erroneously addressing an LCD row of pixels.

The present invention addresses these problems and provides a shift register stage which not only precludes false output values, but also consumes less power.

SUMMARY OF THE INVENTION

The present invention is a shift register stage for inclusion in a cascade connection of like stages and to be energized by plural phase clock signals. Adjacent stages of such cascade connection are energized by different combinations of the plural phase clock signals. The shift register stage includes an input circuit and an output stage. The output stage includes a push-pull amplifier comprising pull up and pull down transistors, each having respective control electrodes. The output terminal of the push-pull amplifier is the output terminal for the shift register stage. The input circuit is responsive to a scan pulse applied to its input terminal for generating first and second control signals which are coupled to the control electrodes of the pull-up and pull-down transistors for conditioning the push-pull amplifier to provide output scan pulses. The principal conduction path of a clamp transistor is coupled between the control electrode of the pull up transistor and a source of potential of value sufficient to turn off the pull up transistor. The control electrode of the clamp transistor is connected to an output terminal of a subsequent stage of said cascade connection.

DETAILED DESCRIPTION

Figure 2:
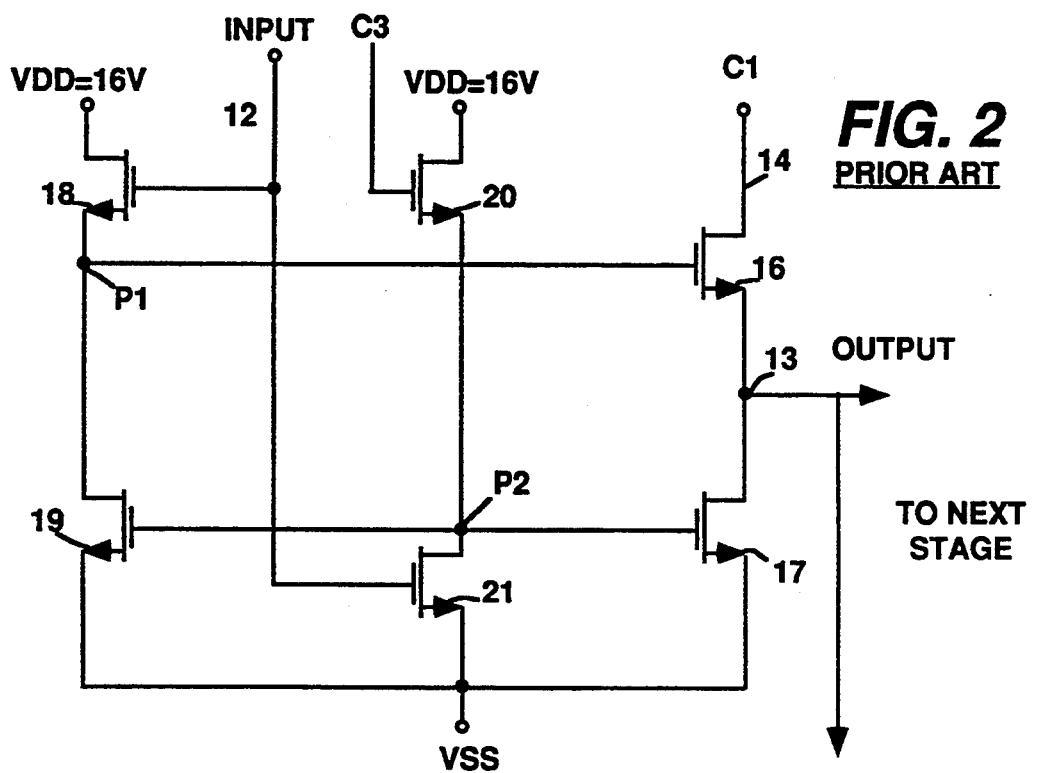
FIG. 2 is a schematic diagram of a known shift register stage which may be utilized in the FIG. 1 shift register.
Figure 3:
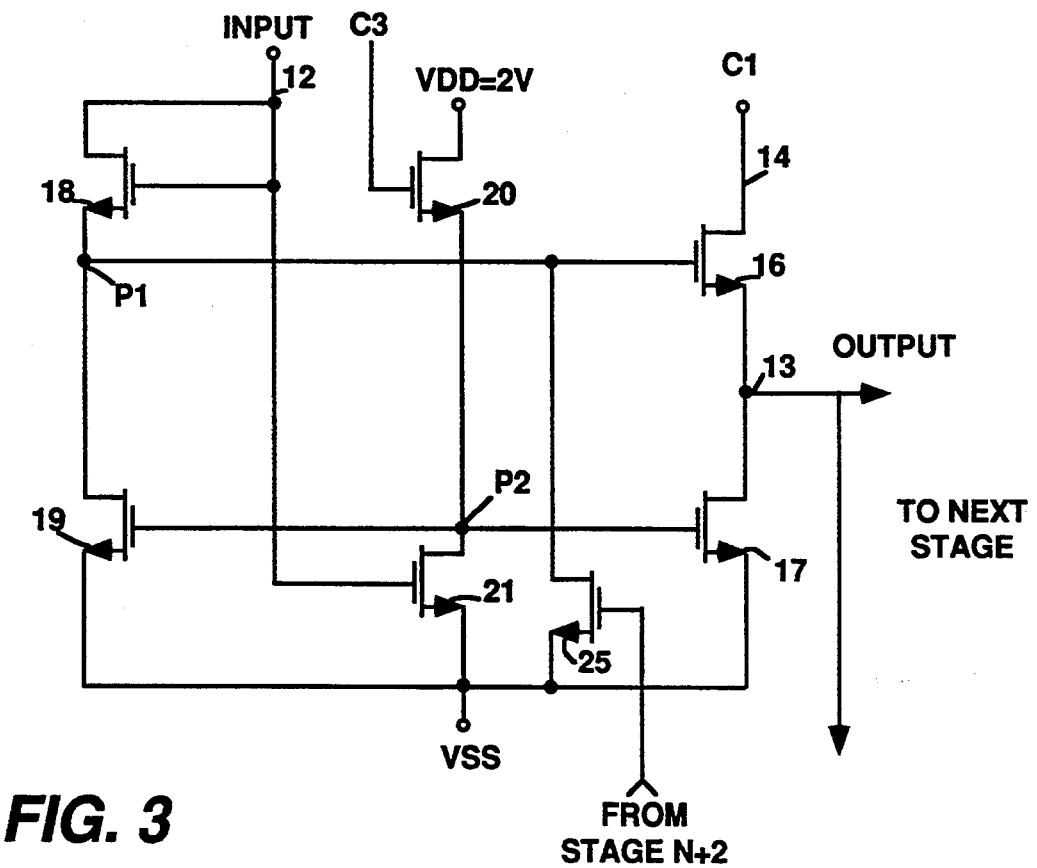
FIG. 3 is a schematic diagram of a shift register stage embodying the present invention.

FIG. 3 illustrates the shift register stage of the present invention. This stage is similar to the FIG. 2 stage but with several significant differences. First an additional transistor 25 is included in the improved stage. Transistor 25 has its drainsource conduction path coupled between node P1 and a point of reference potential sufficient to turn pull-up transistor 16 off. The gate of transistor 25 is connected to the output terminal of a subsequent stage. If the present stage is numbered n in a cascade connection of ordinally numbered stages, the gate of transistor 25 is preferably coupled to the output of stage n+2. However, the gate of transistor 25 may be coupled to an other stage, such as stage n+3, with beneficial results. Transistor 25 will aid in the pull down of node P1 allowing transistor 19 to be smaller in design. In fact the pull down of node P1 may be almost totally under the control of transistor 25 such that the function of transistor 19 may be simply to hold node P1 low once it has been pulled down.

Transistor 19, being relegated to a hold down function can be operated with a lower gate voltage. The supply potential applied to the intermediate stage can therefore be reduced, from for example 16 volts in the FIG. 2 register stage, to about 2 volts in the FIG. 3 register stage. This reduction in supply voltage and consequent reduction in gate voltage applied to transistors 19 and 17 tends to beneficially lessen the amount of drift in the threshold voltage in transistors 19 and 17. This results in the stage becoming significantly more reliable as well as extending its usable lifetime.

The size of transistor 17 can also be reduced because with the inclusion of transistor 25, it can be assured that a) node P1 will be held low precluding transistor 16 from competing with transistor 17, and b) the safety factor for proper operation is increased due to the stabilizing of the threshold voltage of transistor 17. Note that since transistors 19 and 17 may be reduced in size, transistor 25 may be included without increasing the stage area (in integrated form).

An additional change is the elimination of the power supply coupled to the drain electrode of transistor 18 in the FIG. 2 stage. This supply has been replaced by connecting the drain electrode of transistor 18 to the input terminal. Since the transistor 18 draws substantially no source drain current, this connection does not significantly load the output of the preceding cascade connected stage. In addition to eliminating the supply, this change has the further beneficial effect of tending to make the input stage more immune to noise on the input.

Having the gate and drain electrodes of transistor 18 interconnected conditions transistor 18 to operate as a diode. Thus, in fact transistor 18 may be replaced with a diode. Diode connected transistor 18 charges node P1 to the input pulse amplitude (minus a threshold value) and transistors 25 and 19 subsequently discharge node P1. Since a diode connected transistor conducts unidirectionally, the potential at node P1 may beneficially be boosted to higher potentials when the clock signal applied to the supply terminal of the output amplifier goes high. That is the gate to drain and gate to source capacitances of pullup transistor 16 will couple a substantial portion of the clock voltage at terminals 14 and 13 to node P1, thereby enhancing the drive capability of transistor 16.

Figure 4:
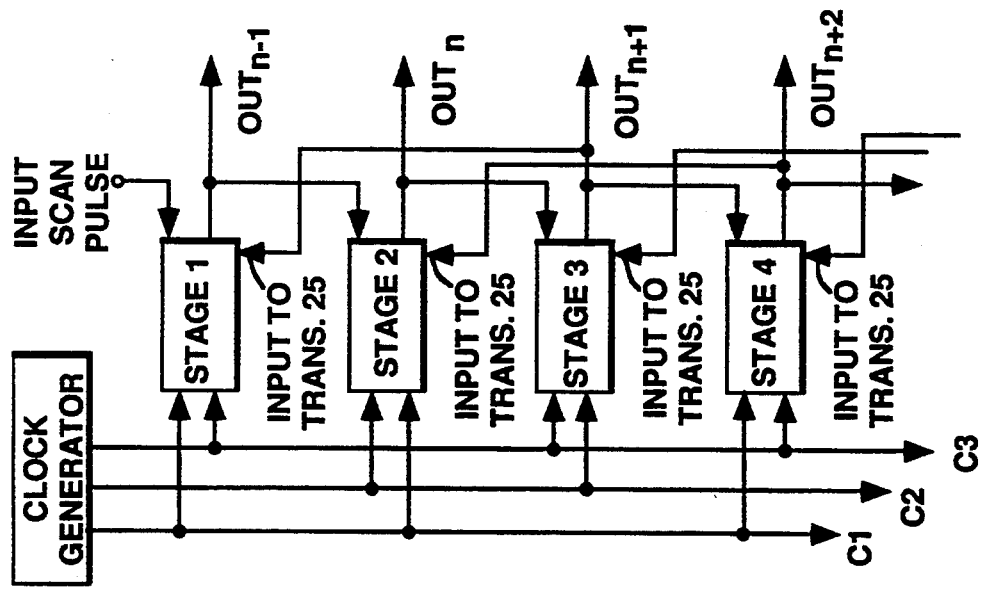
FIG. 4 is a block diagram of a shift register including a cascade connection of a number of stages illustrated in FIG. 3.
Figure 1:
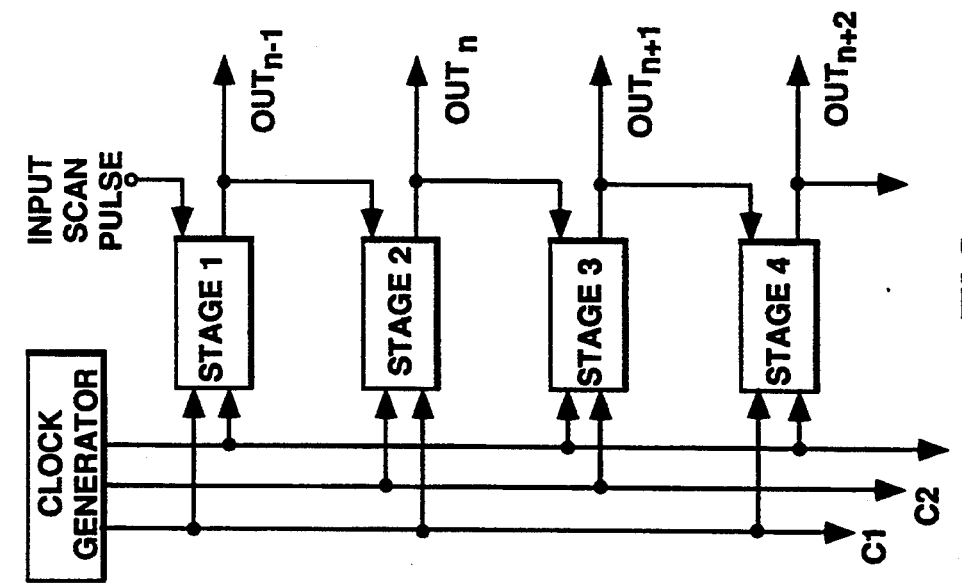
FIG. 1 is a block diagram of a prior art shift register including a plurality of cascaded stages.

FIG. 4 illustrates a cascade connection of a plurality of stages of the type shown in FIG. 3. In the arrangement shown successive register stages are driven by different clock phases of a three phase clock C1, C2, C3. The output terminal of each successive register stage is coupled to the input terminal of the next register stage. The gate electrode of respective transistors 25 of stage n is connected to the output terminal of stage n+2. Recall however, that the gate electrode of the respective transistors 25 may be coupled to the output terminals of other stages i.e. the gate electrode of transistor 25 of stage n may be connected to the output terminal of stage n+3 etc.

Figure 5:
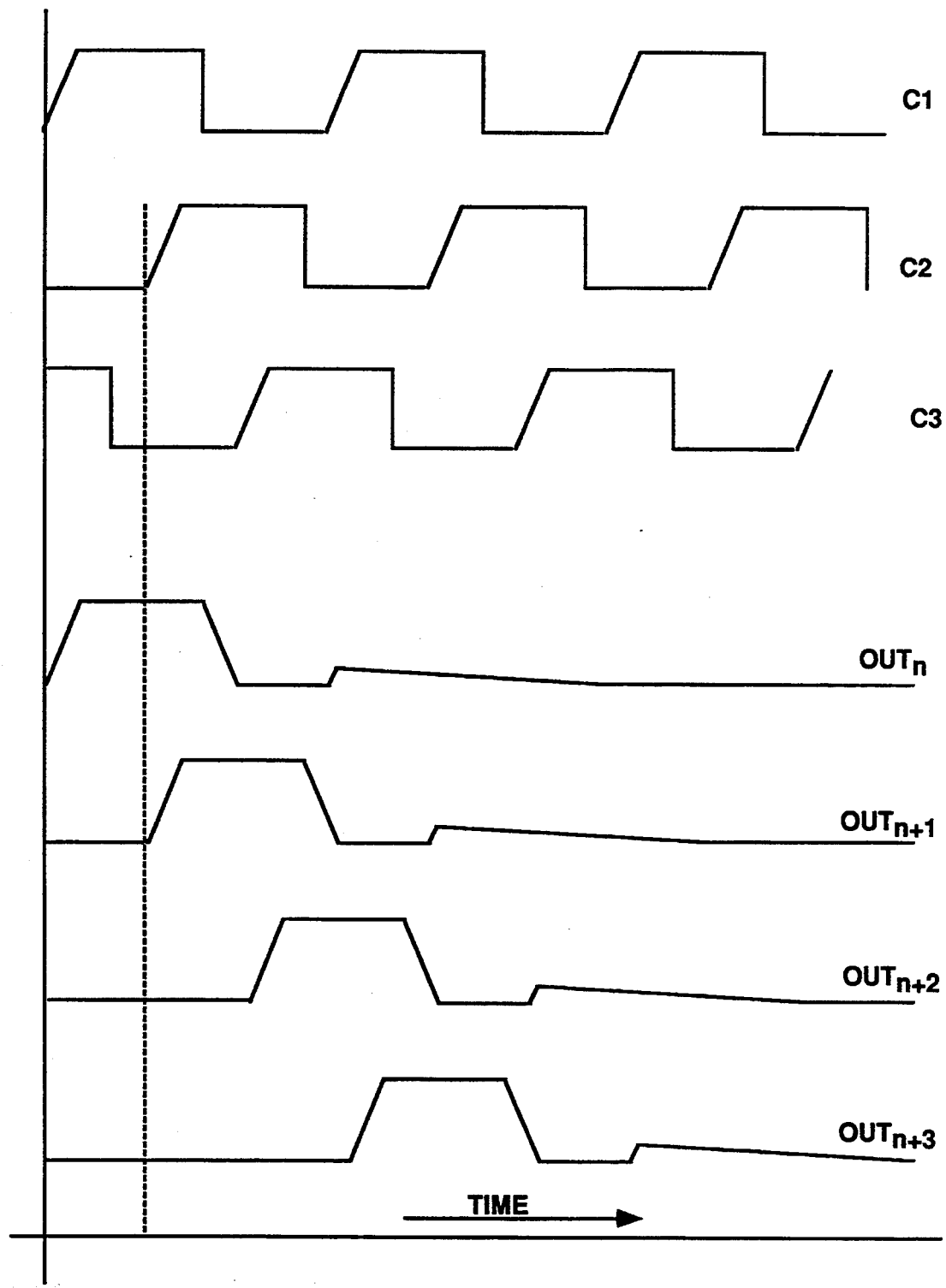
FIG. 5 is a diagram of the relative timing of the output signals and the respective clock signals occurring at respective nodes of the FIGS. 4 shift register utilizing stages illustrated in FIG. 3.

FIG. 5 illustrates voltage-time waveforms for the respective clock phases and selected register stage output terminals. Recall that the output signal of one stage is the input signal for the next stage, hence no unique input signal need be shown. The illustrated shift register of FIG. 4 is shown utilizing 3-phase clocks, hence 3-phase clocks are included in FIG. 5. It can be seen that after each output terminal outputs the scan pulse, there is a small build up in the output potential only immediately following the scan pulse. This occurs because the transistor 19, having been made smaller, has not completely pulled down node P1, and a portion of the clock phase coupled to the supply terminal of the output stage has leaked through transistor 16. Once transistor 25 has been conditioned to conduct, node P1 is pulled completely down, precluding further leakage of clock pulses through respective transistor 16. Note the FIG. 5 waveforms are generated for the gate electrodes of the respective transistors 25 of respective stages n being connected to the output terminals of respective stages n+3.

The output pulses are shown as overlapping. The amount of overlap is a function of the amount by which the clock phases overlap. Thus the desired output pulse overlap is adjustable for a particular application by adjusting the clock phase overlap.

Figure 6:
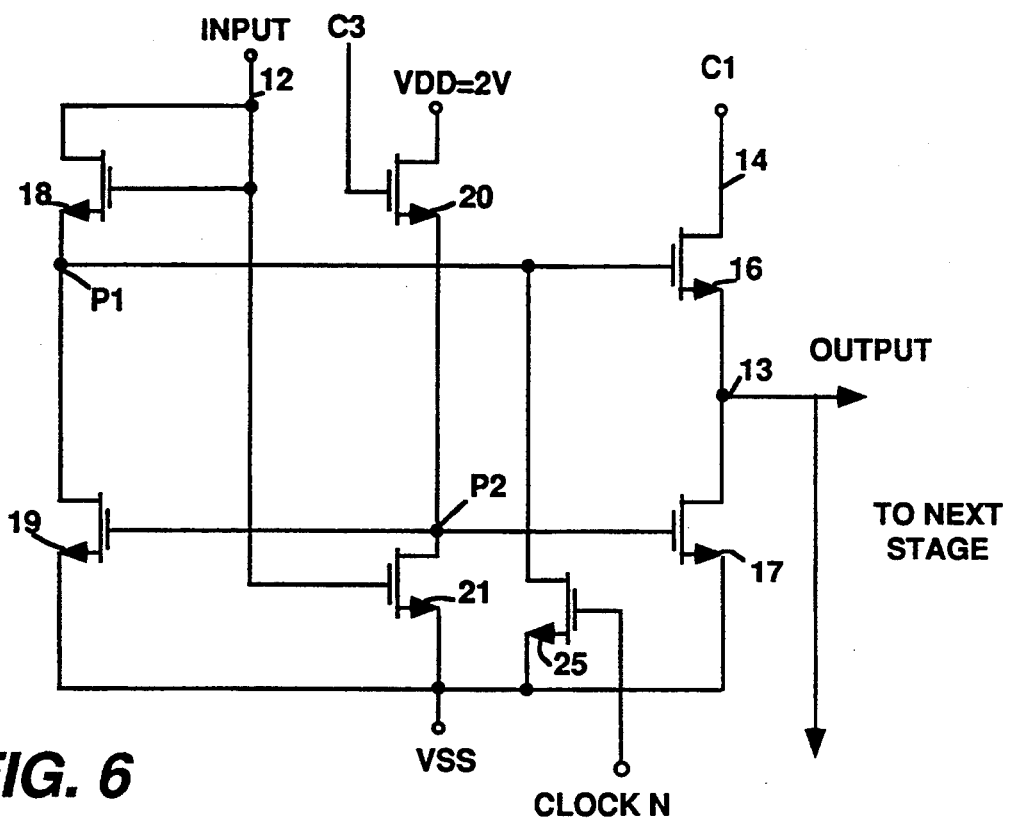
FIGS. 6 and 7 are schematic diagrams of alternative shift register stages embodying the invention.

FIG. 6 illustrates an alternative shift register stage where the control electrode of the clamping transistor 25 is connected to a different one of the clock phases than the one connected to the drain electrode of transistor 16. In a three phase non-overlapping clocking system, the transistor 25 may be connected to the clock phase not connected to transistors 20 and 16. In a greater than three phase clocking system the control electrode of transistor 25 may be connected to one of the alternative clock phases not connected to transistors 20 and 16. The constraint on the clock phase which is connected to the control electrode of the clamping transistor 25 is that its pulses occur after both the input signal pulse phase and the clock phase connected to the drain of transistor 16. Connecting the transistor 25 to a clock phase rather than the output connection of a subsequent register stage provides the circuit designer with layout alternatives with respect to integrated circuit topology.

Figure 7:
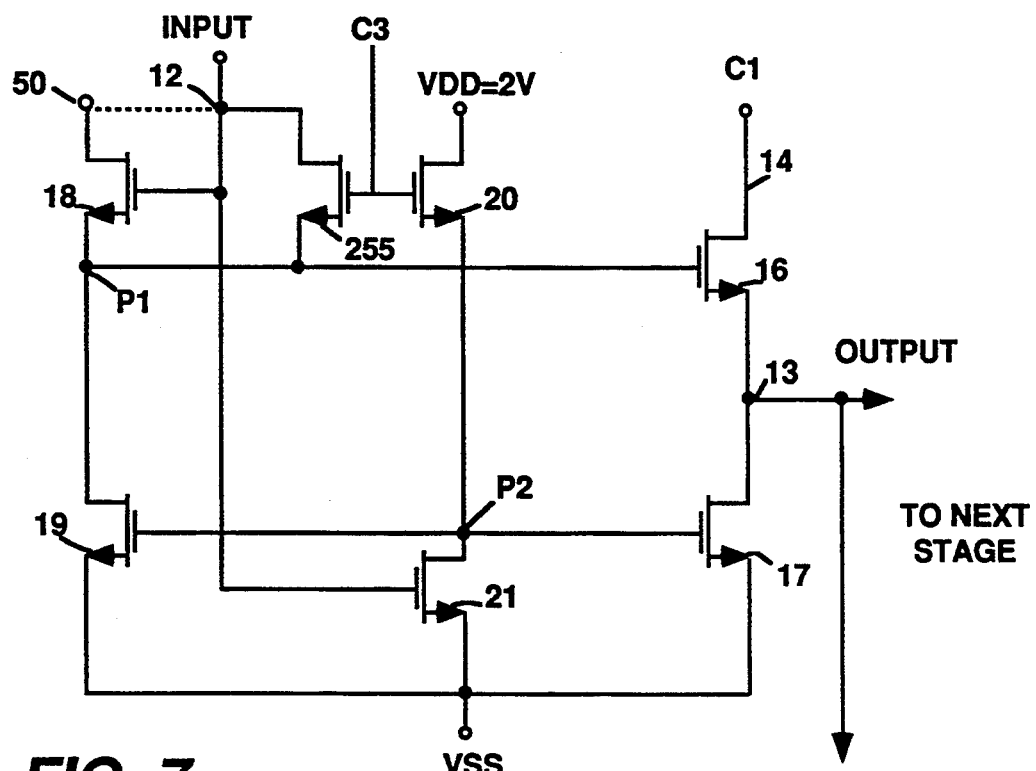

FIG. 7 illustrates a further alternative register stage. In this embodiment the source-drain path of the clamping transistor 255 is connected between node P1 and the input terminal 12, and its control electrode is connected to clock phase C3. The input terminal 12 of an N stage register is held at a low potential (substantially VSS) at least $(N-1)/N^{th}$ of the time the register is operated, hence the clamping transistor 255 will, when turned on, clamp node P1 low to cut off transistor 16. The gate of transistor 255 is pulsed every clock cycle insuring that the node P1 is regularly and frequently clamped low.

Consider a multiphase clock system where the clocks applied to transistors 21 and 20 are successive phases; for example phases C1 and C3 as shown in FIG. 5. The input pulse to terminal 12 will occur concurrently with a C3 clock phase. In this instance transistor 255 will be pulsed on when the input signal on terminal 12 is high. Transistor 255 will therefore aid in pulling node P1 high, allowing transistor 18 to be of smaller dimensions. During the clock cycle that an input pulse is applied to terminal 12, the node P1 will be high for the entire clock cycle. However this has no effect on the desired operation of the shift register. Node P1 will be clamped low by the clock C3 during the next clock cycle.

The drain electrode of transistor 18 may either be connected to a source of constant supply potential, such as VDD, or alternatively it may be connected to the input terminal 12 as shown in FIG. 3.

What is claimed is:

1. A shift register comprising a plurality of substantially identical cascaded stages, each of said stages having an input terminal and an output terminal, said shift register including means for providing a plurality of phase shifted clock signals and means for providing an input signal; said register stages comprising:

an output stage comprising a push-pull amplifier including pull-up and pull-down transistors (16, 17) having respective principal conduction paths connected in series with an interconnection of the pull-up and pull-down transistors forming said register stage output terminal, said push-pull amplifier having a supply terminal (14) for applying one of said plurality of phase shifted clock signals, and said pull-up and pull-down transistors having respective control electrodes;

input circuitry (18–21), responsive to a scan pulse applied to said input terminal (12) for generating first and second control signals which are coupled to the control electrodes of said pull-up and pull-down transistors for conditioning said push-pull amplifier to provide output scan pulses; and a clamping transistor (25) having a conduction path coupled between the control electrode of the pull up transistor and a source of potential (VSS) of value sufficient to turn off the pull up transistor (16), said clamping transistor having a control electrode coupled to the output terminal of a subsequent one of said cascaded stages.

2. The shift register stage set forth in claim 1 wherein said input circuitry includes first (18) and second (19) transistors having their conduction paths coupled in series with an output terminal (P1) formed at an interconnection of said first and second transistors and coupled to the control electrode of the pull up transistor, said first transistor having a control and first electrode coupled to said input terminal (12) of said input stage, for receiving an input scan pulse.

3. The shift register stage set forth in claim 1 wherein said input circuit further includes third (20) and fourth (21) transistors having their conduction paths coupled in series between supply potentials, with an output terminal (P2) formed at an interconnection of said third (20) and fourth (21) transistors and which is coupled to the control electrode of said pull down transistor and to a control electrode of said second transistor, said third transistor having a control electrode coupled to one of said plurality of phase shifted clock signals, and said fourth transistor having an input terminal coupled to the input terminal (12) of said input stage.

4. The shift register stage set forth in claim 1 wherein said input circuitry includes a diode and a transistor having their conduction paths coupled in series with an output terminal (P1) formed at an interconnection of said diode and transistor and coupled to the control electrode of said pull up transistor, said diode having an electrode coupled to said input terminal of said stage for receiving a scan pulse.

5. A shift register comprising a plurality of substantially identical cascaded stages, each of said stages having an input terminal and an output terminal, said shift register including means for providing a plurality of phase shifted clock signals and means for providing an input signal; said register stages comprising:

an output stage comprising a push-pull amplifier including pull-up (16) and pull-down (17) transistors having respective principal conduction paths connected in series with an interconnection of the pull-up and pull-down transistors forming said register stage output terminal, said push-pull amplifier having a supply terminal (C1) for applying one of said plurality of phase shifted clock signals, and said pull-up and pull-down transistors having respective control electrodes;

an input stage (18, 19) having an output terminal (P1) coupled to the control electrode of said pull-up transistor, and having an input terminal (12) for receiving an input signal, said input stage output terminal following potential changes applied to said input terminal at least for input signal transitions in one direction;

an intermediate stage (20, 21) including a clocked inverting amplifier, having an output terminal (P2) coupled to the control electrode of said pull-down transistor, an input terminal coupled to the input terminal of said register stage, a supply terminal (VDD) for applying supply potential, and a clock input terminal (C3) for applying another of said plurality of phase shifted clock signals, said another of said plurality of phase shifted clock signals selectively activating said inverting amplifier; and a clamping transistor (25) having a conduction path coupled between the control electrode of the pull up transistor and a source (VSS) of potential of value sufficient to turn off the pull up transistor, said clamping transistor having a control electrode coupled to the output terminal of a subsequent one of said cascaded stages.

6. The shift register stage set forth in claim 5 wherein said input stage includes first and second transistor having their conduction paths coupled in series with said output terminal of said input stage formed at an interconnection of said first and second transistors, said first transistor having a control and first electrode coupled to said input terminal of said input stage, and said second transistor having a control electrode coupled to the output terminal of said intermediate stage.

7. The shift register stage set forth in claim 5 wherein said intermediate stage includes first and second transistor having their conduction paths coupled in series between supply potentials, with said output terminal of said intermediate stage formed at an interconnection of said first and second transistors, said first transistor having a control electrode coupled to said another of said plurality of phase shifted clock signals, and said second transistor having an input terminal coupled to the input terminal of said input stage.

8. The shift register stage set forth in claim 7 wherein said input stage includes third and fourth transistors having respective conduction paths coupled in series with said output terminal of said input stage formed at an interconnection of said third and fourth transistors, said third transistor having a control and first electrode coupled to said input terminal of said input stage, and said fourth transistor having a control electrode coupled to the output terminal of said intermediate stage.

9. The shift register stage set forth in claim 5 wherein said input stage includes a diode and a transistor having their conduction paths coupled in series with said output terminal of said input stage formed at an interconnection of said diode and transistor, said diode having an electrode coupled to said input terminal of said input stage, and said transistor having a control electrode coupled to the output terminal of said intermediate stage.

10. A shift register comprising a plurality of substantially identical cascaded stages, each of said stages having an input terminal and an output terminal, said shift register including means for providing a plurality of phase shifted clock signals and means for providing an input signal; said register stages comprising:
an output stage comprising a push-pull amplifier including pull-up and pull-down transistors having respective principal conduction paths connected in series, with an interconnection of the pull-up and pull-down transistors forming said register stage output terminal, said push-pull amplifier having a supply terminal for applying one of said plurality of phase shifted clock signals, and said pull-up and pull-down transistors having respective control electrodes;
input circuitry, responsive to a scan pulse applied to said input terminal for generating first and second control signals which are coupled to the control electrodes of said pull-up and pull-down transistors for conditioning said push-pull amplifier to provide output scan pulses; and
a clamping transistor having a control electrode and having a conduction path coupled between the control electrode of said pull up transistor and a source of potential, said potential having a value, at least fifty percent of the time during which said register is energized, sufficient to turn off the pull up transistor; and
means for applying a control signal to the control electrode of said clamping transistor, said control signal being substantially out of phase with said one of said plurality of phase shifted clock signals.

11. The shift register set forth is claim 10 wherein said means for applying a control signal to the control electrode of said clamping transistor comprises a connection to another of said plurality of phase shifted clock signals different from said one of said plurality of phase shifted clock signals.

12. The shift register set forth in claim 11 wherein said source of potential comprises a connection to said stage input terminal.

13. The shift register stage set forth in claim 10 wherein said input circuitry includes first and second transistors having their conduction paths coupled in series with an output terminal formed at an interconnection of said first and second transistors and coupled to the control electrode of the pull up transistor, said first transistor having a control and first electrode coupled to said input terminal of said input stage, for receiving an input scan pulse.

14. The shift register stage set forth in claim 10 wherein said input circuit further includes third and fourth transistors having their conduction paths coupled in series between supply potentials, with an output terminal formed at an interconnection of said third and fourth transistors and which is coupled to the control electrode of said pull down transistor and to a control electrode of said second transistor, said third transistor having a control electrode coupled to one of said plurality of phase shifted clock signals, and said fourth transistor having an input terminal coupled to the input terminal of said input stage.

15. The shift register stage set forth in claim 10 wherein said input circuitry includes a diode and a transistor having their conduction paths coupled in series with an output terminal (P1) formed at an interconnection of said diode and transistor and coupled to the control electrode of said pull up transistor, said diode having an electrode coupled to said input terminal of said stage for receiving a scan pulse.

16. A shift register comprising a plurality of substantially identical cascaded stages, each of said stages having an input terminal and an output terminal, said shift register including means for providing a plurality of phase shifted clock signals and means for providing an input signal; said register stages comprising:
an output section comprising a pull-up transistor having a principal conduction path connected in series with a DC impedance, and wherein an interconnection of the pull-up transistor and the DC impedance constitutes said register stage output terminal, said output section having a supply terminal for applying one of said plurality of phase shifted clock signals to the principal conduction path of said pull-up transistor, and said pull-up transistor having a control electrode;
input circuitry including a clamping transistor, said input circuitry responsive to a scan pulse applied to said input terminal of said stage for generating a control signal which is coupled to the control electrode of said pull-up transistor for conditioning said output section to provide output scan pulses, and said clamping transistor having a principal conduction path coupled between the control electrode of said pull up transistor and a source of potential sufficient to turn off said pull up transistor and having a control electrode coupled to an output terminal of a subsequent stage of said cascaded stages.

17. The shift register stage set forth in claim 16 wherein said input circuitry includes a diode and said clamping transistor having respective principal conduction paths coupled in series with an output terminal (P1) formed at an interconnection of said diode and clamping transistor and coupled to the control electrode of said pull up transistor, said diode having an electrode coupled to said input terminal of said stage for receiving a scan pulse.

18. The shift register stage set forth in claim 16 wherein said input circuitry includes a first transistor and said clamping transistor having respective principal conduction paths coupled in series with an output terminal formed at an interconnection of said first and clamping transistors and coupled to the control electrode of the pull up transistor, said first transistor having at least a control electrode coupled to said input terminal of said input stage, for receiving an input scan pulse.

19. The shift register stage set forth in claim 16 wherein said DC impedance is a transistor having a principal conduction path in series with the principal conduction path of said pull-up transistor, and having a control electrode, and;

circuitry for applying to said control electrode of said transistor, for at least a portion of at least one period of said phase shifted clock signals, a potential of sufficient magnitude to condition said transistor into conduction.

20. The shift register stage set forth in claim 16 wherein said circuitry for applying a potential of sufficient magnitude to condition said transistor into conduction comprises:

an inverting amplifier having an input terminal coupled to the input terminal of said stage and an output terminal coupled to the control electrode of said transistor.

* * * * *